(12) United States Patent
Amemiya

(10) Patent No.: US 7,465,523 B2
(45) Date of Patent: Dec. 16, 2008

(54) METHOD FOR MANUFACTURING TRANSFER MASK SUBSTRATE, TRANSFER MASK SUBSTRATE, AND TRANSFER MASK

(75) Inventor: Isao Amemiya, Yamanashi-ken (JP)

(73) Assignee: Hoya Corporation (JP)

( * ) Notice: Subject to any disclaimer, the term of this patent is extended or adjusted under 35 U.S.C. 154(b) by 837 days.

(21) Appl. No.: 10/506,116

(22) PCT Filed: Nov. 5, 2003

(86) PCT No.: PCT/JP03/14088

§ 371 (c)(1),
(2), (4) Date: Jan. 3, 2005

(87) PCT Pub. No.: WO2004/044967

PCT Pub. Date: May 27, 2004

(65) Prior Publication Data

US 2005/0175905 A1      Aug. 11, 2005

(30) Foreign Application Priority Data

Nov. 5, 2002   (JP)   ............................... 2002-321771

(51) Int. Cl.
*G03F 9/00*   (2006.01)
(52) U.S. Cl. ........................... 430/5; 430/313; 430/314; 430/316
(58) Field of Classification Search ...................... 430/5, 430/313, 314, 316; 378/34, 35
See application file for complete search history.

(56) References Cited

U.S. PATENT DOCUMENTS 6,381,300 B1 *   4/2002   Ezaki ........................... 378/35

FOREIGN PATENT DOCUMENTS

| EP | 0 542 519 A1 | 5/1993 |
|---|---|---|
| EP | 1 065 566 | 1/2001 |
| JP | 05-299326 | 11/1993 |
| JP | 10-261584 A | 9/1998 |
| JP | 2829942 B2 | 9/1998 |
| JP | 2002-075836 A | 3/2002 |
| JP | 2003-068615 A | 3/2003 |

OTHER PUBLICATIONS

International search report for PCT application No. PCT/JP03/14088, dated Feb. 24, 2004.
Tsuboi, S. et al, "X-Ray Mask Distortion Induced in Black-Etching Preceding Subtractive Fabrication: Resist and Absorber Stress Effect," Jpn. J. Appl. Phys., vol. 35, part 1, No. 5A, pp. 2845-2850, May 1996.

* cited by examiner

Primary Examiner—Christopher G Young
(74) Attorney, Agent, or Firm—Cook Alex Ltd.

(57) ABSTRACT

To reduce a stress change generated in the production processes of a transfer mask to improve a position accuracy of a mask pattern.

A production method of a transfer mask characterized by further including, in the production processes of the transfer mask, a step of forming on said thin film layer a stress control layer that cancels a stress change of the thin film layer generated in the production processes of the mask, prior to formation of said resist layer, and a step of carrying out etching using said resist pattern as an etching mask.

4 Claims, 8 Drawing Sheets

|  |  | EXAMPLE 1 | EXAMPLE 2 | EXAMPLE 3 | EXAMPLE 4 |
| --- | --- | --- | --- | --- | --- |
| STRESS CONTROL LAYER | MATERIAL | AMORPHOUS CARBON | DLC | SiONx | SiO$_2$ |
|  | FILM THICKNESS | 0.2 μm | 0.10 μm | 0.2 μm | 0.2 μm |
|  | YOUNG'S MODULUS | 50 GPa | 96 GPa | 71 GPa | 72 GPa |
|  | FILM STRESS | -80 MPa | -140 MPa | -24 MPa | -81 MPa |
|  | TOTAL STRESS | 16 N/m | 14 N/m | 4.8 N/m | 16.2 N/m |
| RESIST LAYER | KIND | ZEP | PHS | PHS | ZEP |
|  | FILM THICKNESS | 0.5 μm | 0.5 μm | 0.3 μm | 0.4 μm |
|  | YOUNG'S MODULUS | 24 GPa | 18 GPa | 24 GPa | 18 GPa |
|  | FILM STRESS | 15 MPa | 9 MPa | 8 MPa | 24 MPa |
|  | TOTAL STRESS | 7.5 N/m | 4.5 N/m | 2.4 N/m | 9.6 N/m |
| PATTERN | KIND | HIGH DENSITY PATTERN | HIGH DENSITY PATTERN | LOW DENSITY PATTERN | HIGH DENSITY PATTERN |
|  | FILM THICKNESS OF THIN FILM LAYER | 2.0 μm | 2.0 μm | 2.0 μm | 2.0 μm |
|  | FILM STRESS | 10 MPa | 10 MPa | 4.9 MPa | 4.9 MPa |
|  | STRESS CHANGE | 5.5 MPa | 5.5 MPa | 1.1 MPa | 3.1 MPa |
|  | TOTAL STRESS | 11 N/m | 11 N/m | 2.2 N/m | 6.2 N/m |

FIG. 9

METHOD FOR MANUFACTURING TRANSFER MASK SUBSTRATE, TRANSFER MASK SUBSTRATE, AND TRANSFER MASK

TECHNICAL FIELD

The present invention relates to a transfer mask for use in a lithography technique using charged particle beams or the like and, in particular, relates to a transfer mask substrate for a stencil mask or the like for use in a lithography technique using electron beams for producing a semiconductor device or the like, a production method of a transfer mask, and so forth.

BACKGROUND ART

In the lithography technique for forming wiring patterns and so forth, following the fact that formation patterns have been becoming much finer, it has become difficult to form the patterns using a light lithography technique being a conventional general-purpose technique, and therefore, an exposure technique using charged particle beams such as electron beams or ion beams, or short wavelength beams of an X-ray source or the like has been positively discussed for achieving further fineness. Among them, an electron beam writing technique has been fostered such that there have been proposed a variable-shaped writing method which, starting from the initial spot beam writing, carries out writing by changing the size and shape of rectangular beams, and subsequently, a partial batch writing method that writes part of a pattern partially in a batch via a mask and repeats it, in terms of improving pattern accuracy, shortening a writing time, and so forth. Then, subsequently to the partial batch writing method, a new electron projection system (SCALPEL system) was proposed by S. D. Berger, et al. about eight years ago. Thereafter, there have been various proposals about similar writing systems (PREVAIL systems), and transfer mask (reticle) structures for application to these writing systems and production methods thereof.

For example, in the PREVAIL system invented by H. C. Pfeiffer, et al., in brief, preparation is made of a stencil mask formed with a through hole (aperture) pattern that is formed with predetermined size and arrangement in each of small regions, then charged particle beams are irradiated onto the small regions so that beams formed via the through hole patterns are applied via an optical system onto a to-be-exposed substrate formed thereon with a photosensitive member to thereby transfer the through hole patterns in a reduced size on the substrate, so that a device pattern is formed while joining together on the exposed substrate the predetermined patterns that are dividedly formed on the mask (see Publication of Pat. No. 2,829,942). The transfer mask proposed for this system is mainly configured by a stencil type mask with pattern portions comprising through holes not shielded at all (see Laid-open Unexamined Patent Publication No. Hei 10-261584 and Laid-open Unexamined Patent Publication No. Hei 10-260523). In the stencil type mask, by dividing and reinforcing a pattern region from the back by the use of a strut (frame) structure, reduction in deflection of the pattern region is achieved to thereby achieve improvement in pattern position accuracy, and so forth.

On the other hand, as a mask structure for the SCALPEL system, a scattering mask (reticle) has been mainly proposed rather than the stencil mask (see Laid-open Unexamined Patent Publication No. Hei 10-261584). According to the description thereof, the mask structure is such that a heavy metal layer is formed on a membrane (self-standing thin film) of SiN or the like, and predetermined pattern formation is applied to the heavy metal layer. Although electron beams are irradiated onto both layers, the electron scattering degree differs according to the presence or absence of electron beam scatterers. It is a method of obtaining beam contrasts on a wafer utilizing this difference in scattering degree to thereby carry out transfer of patterns in a reduced size.

These exposure systems each satisfy a high resolution being a feature of the charged particle beam and enable pattern formation finer than 0.1 μm and, when compared with the partial batch method, achieve improvement in throughput in the production of devices (e.g. throughput of 30 sheets or more per hour with the minimum line width of 0.08 μm and 8-inch substrates) due to large magnification of a shot size (e.g. magnification of the maximum shot size from 5 μm to 250 μm on an exposed substrate) and so forth, and have a machine capability of dealing with production of general-purpose devices, and therefore, are highly practical systems.

In the lithography masks as described above, the position accuracy of the mask patterns is very important in terms of a registration accuracy of transferred patterns. Particularly, when the patterns are formed in the self-standing thin film, there has been a problem that the pattern position accuracy is easily lowered due to influence of a film stress thereof.

With respect to such a problem, there has been proposed a method of rendering a stress of a self-standing thin film as small as possible in a tensile direction, and selecting a material providing a small film stress of a photosensitive member (resist) used for pattern formation or achieving reduction of a stress of a resist by a heat treatment condition (see S. Tsuboi, et al. Jpn. J. Appl. Phys. 35. 2845 (1996)).

However, in the method of rendering the stress of the self-standing thin film as small as possible in the tensile direction and reducing the stress of the resist, the resist stress can not be reduced to zero, and therefore, there has been a limit as a measure for solution. Further, there has been a problem that although the self-standing thin film to be formed with patterns is normally required to have a minimum tensile stress for ensuring its self-standing property, the continuity of the self-standing thin film is reduced due to the pattern formation in the self-standing thin film, and therefore, the stress of the self-standing film changes unavoidably before and after the pattern formation. To this end, it has been difficult to produce a mask so as to stably obtain a high position accuracy (10 nm or less).

DISCLOSURE OF THE INVENTION

The present invention has been made in view of the foregoing circumstances and has an object to provide a transfer mask producing method that can produce a transfer mask with a high position accuracy, a transfer mask having a high position accuracy which is obtained by such a method, and a transfer mask substrate that can produce a transfer mask with a high position accuracy.

The present invention has the following structure.

(Structure 1) A production method of a transfer mask, comprising a step of preparing a substrate having a substrate for forming a support by back etching for supporting a thin film layer, an etching stopper layer formed on said substrate, and the thin film layer formed on said etching stopper layer; a step of carrying out back etching of the substrate; a step of forming a resist layer on said thin film layer; a step of carrying out writing/development of a predetermined mask pattern relative to said resist layer to form a resist pattern; and a step of forming a mask pattern in the thin film layer using said resist pattern, said method characterized by further comprising a step of, before forming said resist layer, forming on said thin film layer a stress control layer that cancels a stress change of the thin film layer generated in production processes of the mask; and a step of etching said stress control layer along with formation of said mask pattern.

(Structure 2) A production method of a transfer mask according to claim 1, characterized by comprising a step of removing the stress control layer after forming the mask pattern in the thin film layer.

(Structure 3) A production method of a transfer mask according to claim 1 or 2, characterized in that the stress control layer is made of a material selected from amorphous carbon, DLC, $SiO_x$, and $SiO_xN_y$.

(Structure 4) A transfer mask characterized by being produced by the production method of the transfer mask according to one selected from Structures 1 to 3.

(Structure 5) A transfer mask substrate comprising a support for supporting a thin film layer, an etching stopper layer formed on said support, and the thin film layer formed on said etching stopper layer, said transfer mask substrate characterized by comprising, on said thin film layer, a stress control layer that cancels a change in stress of the thin film layer generated in production processes of a mask.

BRIEF DESCRIPTION OF THE DRAWINGS

FIG. 9 is a diagram showing stresses etc. of respective films in Example 1 to Example 4.

BEST MODE FOR CARRYING OUT THE INVENTION

Hereinbelow, the present invention will be described in detail.

The present inventors have reached the present invention by paying attention to a stress change generated in the production processes of a transfer mask and finding that the stress change generated in the production processes of the transfer mask can be suppressed by forming a stress control film, which serves to cancel (correct) the stress change generated in the production processes of the transfer mask, on a thin film layer before forming a resist layer, to thereby enable improvement in position accuracy of mask patterns.

Here, the total stress in the thin film can be expressed by the following equation 1.

$$\text{Total Stress } (S)[N \cdot M] = \text{Film Internal Stress } (\sigma) \times \text{Thickness } (t) \quad \text{[Equation 1]}$$

Further, assuming that the film structure in the production processes of the transfer mask is composed of two layers, i.e. the thin film layer and the resist layer, the total stress change in the production processes of the transfer mask (pattern writing to mask completion) can be estimated as Total Stress (SR) of Resist+Total Stress Change (SC) of Thin Film Layer.

Therefore, by estimating in advance the total stress change to be generated in the production processes and forming a compressive stress layer having a stress for canceling such a stress change, before forming the resist layer that is considered to affect the stress change, the total stress change can be resultantly suppressed. That is, when the total stress change is on the side of a tensile stress, the stress control layer should be a thin film that acts on the side of a compressive stress.

Figure 1:
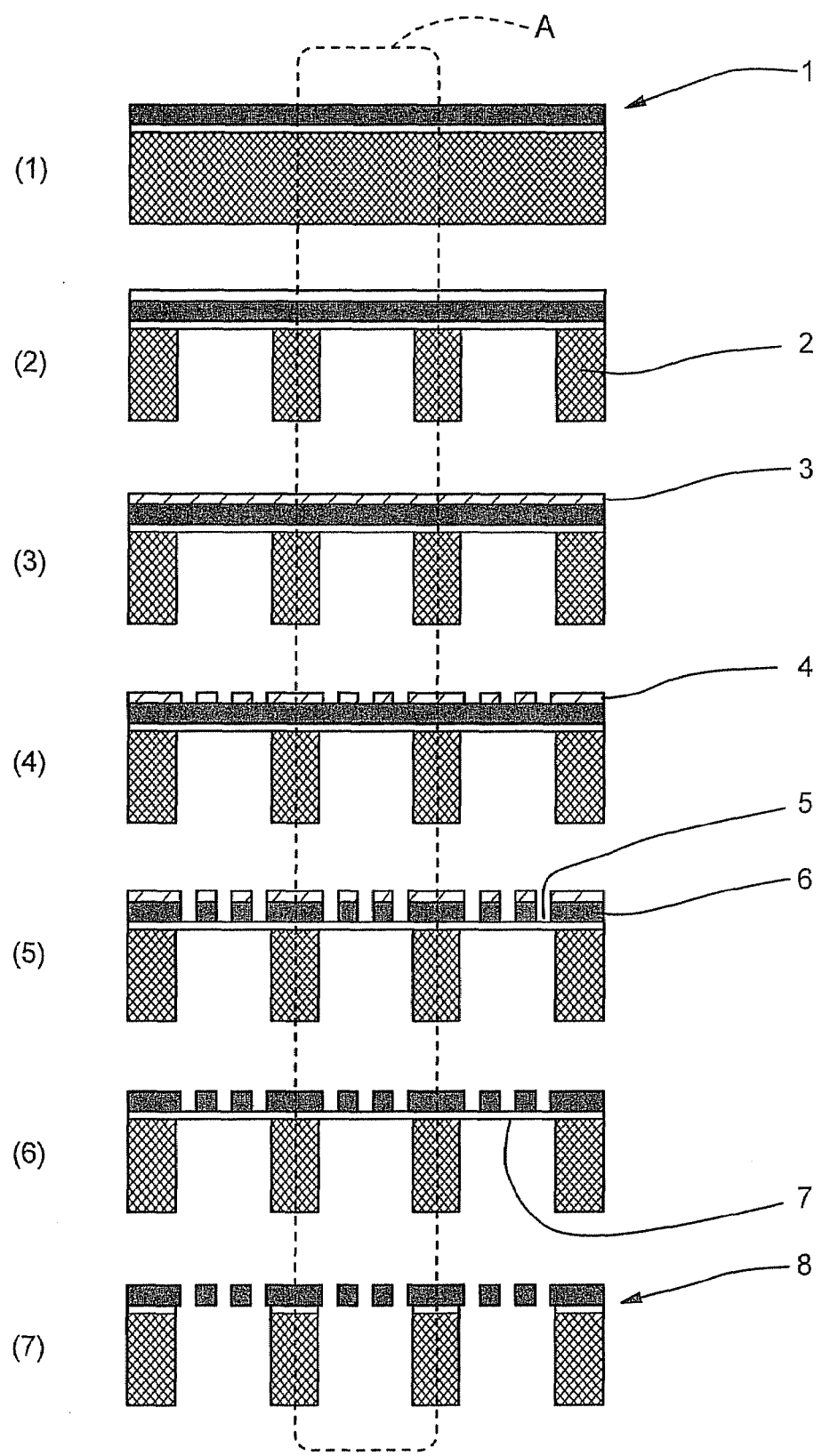
FIG. 1 is a production process diagram of a conventional stencil mask.
Figure 2:
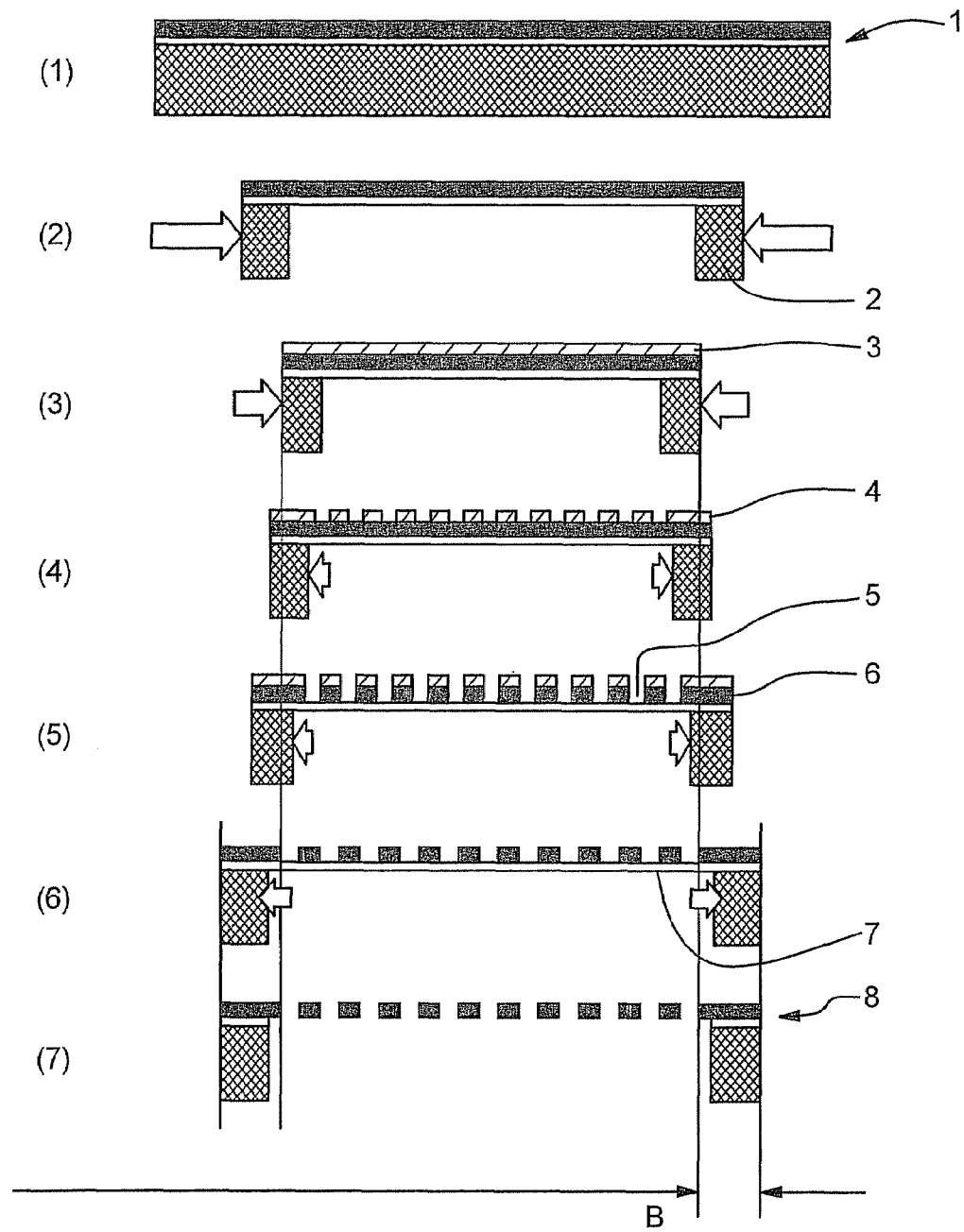
FIG. 2 is a production process diagram of the conventional stencil mask.

Hereinbelow, the principle of the present invention will be explained concretely using production process diagrams of a conventional stencil mask as shown in FIGS. 1 and 2. Incidentally, FIG. 2 is a partial enlarged view of a dotted-line portion A in FIG. 1. First, preparation is made of a substrate 1 (SOI substrate or the like) having a substrate for forming a support by back etching for supporting a thin film layer, an etching stopper layer formed on the substrate, and the thin film layer formed on the etching stopper layer (see FIG. 1(1) and FIG. 2(1)). Then, the etching is applied from the back side to form a strut (see FIG. 1(2) and FIG. 2(2)).

Then, a resist layer 3 is formed on the surface of the substrate (see FIG. 1(3) and FIG. 2(3)). This resist layer has an internal stress and is, for example, a ZEP resist with 18 to 25 MPa produced by Zeon Corporation or a PHS resist with 8 to 15 MPa produced by Tokyo Ohka Kogyo Co., Ltd.

Then, mask patterns are written in thin film areas where the backs were etched, while performing alignment adjustment, and then developed to thereby form resist patterns 4 (see FIG. 1(4) and FIG. 2(4)). Using this resist as an etching mask, the Si thin film layer is etched using $SF_6$ as an etching main gas to thereby form aperture patterns 5 in the Si thin film layer 6 (see FIG. 1(5) and FIG. 2(5)). For example, in this event, in case of a high density pattern (Representing a pattern of density 40%. The same shall apply hereinafter.), an internal stress of the Si thin film layer 6 before the etching was 10 MPa, an internal stress after the etching was 4.5 MPa, and a stress change was 5.5 MPa, while, in case of a low density pattern (Representing a pattern of density 10%. The same shall apply hereinafter.), an internal stress of the Si thin film layer 6 before the etching was 10 MPa, an internal stress after the etching was 7.9 MPa, and a stress change was 2.1 MPa.

Subsequently, the remaining resist patterns are peeled off (see FIG. 1(6) and FIG. 2 (6)), and then the etching stopper 7 is removed to thereby obtain a stencil mask 8 (see FIG. 1(7) and FIG. 2(7)).

In the stencil mask obtained by the conventional method as described above, a distortion amount (position accuracy) of the thin film layer indicated by B in FIG. 1(7) and FIG. 2(7) is large. For example, the total stress change, when a ZEP resist (15 MPa) having a thickness of 0.5 μm is used as a resist layer and a high density pattern (density 40%) is formed in a thin film layer having a thickness of 2 μm, becomes (15 MPa×0.5 μm)(SR)+(5.5 MPa×2 μm)(SC)=18.5 N/m.

Figure 3:
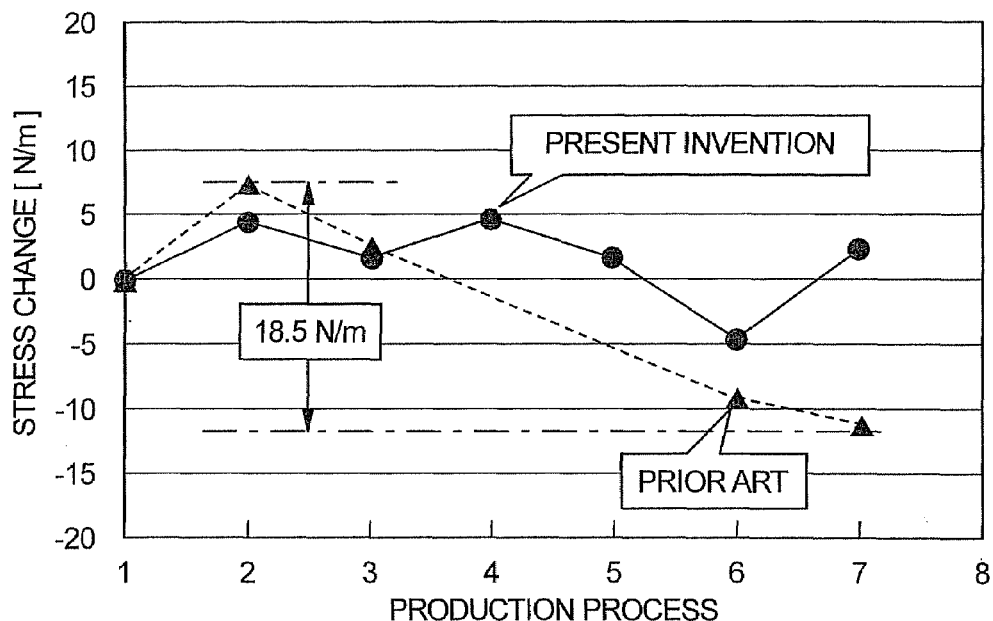
FIG. 3 is a diagram showing stress changes in each of production processes with respect to the present invention and a prior art.

FIG. 3 shows stress changes in each of production process with respect to a case using the stress control layer (Present Invention) and a case not using it (Prior Art). Incidentally, in the production processes, 1: in the state of the substrate, 2: resist application and baking, 3: resist patterning, 4: thin film layer etching, 5: resist peeling-off, and 6: etching stopper removal. It is seen from this figure that, in the production processes of the stencil mask, a stress change of 18.5 N/m is generated in the foregoing example while it is largely improved in the present invention.

Figure 4:
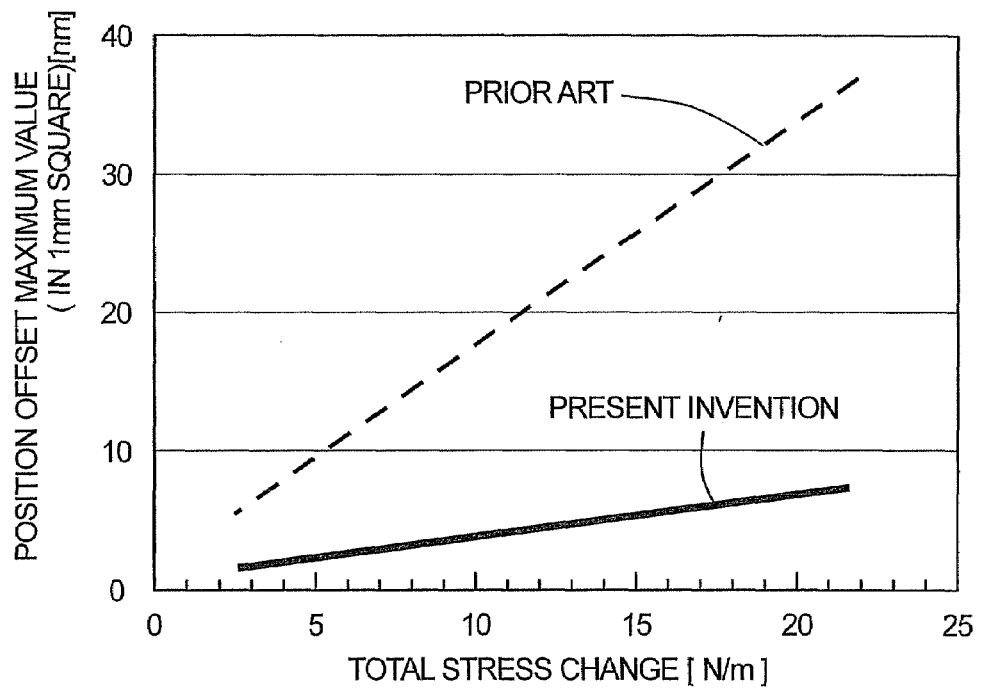
FIG. 4 is a diagram showing position offsets of mask patterns relative to the total stress changes with respect to the present invention and the prior art.

FIG. 4 shows position offsets of mask patterns relative to the total stress changes with respect to the case using the stress control layer (Present Invention) and the case not using it (Prior Art). It is seen from this figure that the position offset of the pattern is largely improved in the present invention.

Ideally speaking, it is desirable that the stress control layer fully cancel the total stress. However, even if there is a deviation of ±20%, preferably about ±10%, it is within the effect of the present invention.

For the stress control layer, use can be made of a material selected from amorphous carbon, DLC, $SiO_x$, and $SiO_xN_y$. In case of such a material, a stress can be adjusted by a film forming condition in case of carbon such as amorphous carbon or DLC, while a stress can be controlled by the content of oxygen or the content of nitrogen apart from the film forming condition in case of $SiO_x$ or $SiO_xN_y$ (X=1 to 2 in case of $SiO_x$, X=0.2 to 1.9 and Y=0.1 to 1.6 in case of $SiO_xN_y$).

Inasmuch as the stress control layer is formed between the thin film layer and the resist layer, it is etched simultaneously with formation of mask patterns, i.e. it is etched using resist patterns as an etching mask for forming the mask patterns. When producing the stencil mask, since the stress control layer is etched prior to etching the thin film layer (silicon), it can also be used to serve as an etching mask upon etching the thin film layer (silicon). In this case, when the stress control layer is made of carbon, etching is made possible in dry etching using the same etching gas so that the stress control layer and the thin film layer can be etched continuously using the same resist patterns. When the stress control layer is made of $SiO_x$ or $SiO_xN_y$, a dry etching gas different from that used in etching the thin film layer (Si) is used, and therefore, it is preferable to remove the resist patterns before etching the thin film layer (Si) in terms of preventing failure in the etching of the thin film layer (Si).

Further, it is desirable that the stress control layer be selectively removed finally. As a removing method, when, for example, the stress control layer is made of carbon, it can be easily removed along with the resist patterns by ashing by the use of oxygen, or the like. On the other hand, when the stress control layer is made of $SiO_x$ or $SiO_xN_y$, it can be selectively removed using buffered hydrofluoric acid (BHF) or the like. It is considered that the present invention is effectively applied to the production of the stencil mask because influence of distortion is large in the stencil mask, but the present invention is also applicable to other transfer masks using a self-standing thin film layer.

As a substrate having a substrate for forming a support by back etching for supporting a thin film layer, an etching stopper layer formed on the substrate, and the thin film layer formed on the etching stopper layer, which is used in the present invention, there may be used a so-called SOI (Silicon On Insulator) substrate having a structure of $Si/SiO_2/Si$, or a substrate using metal, metal compound, carbon, carbon compound, or the like as the etching stopper instead of $SiO_2$.

Further, in the production method in the present invention, the back etching of the substrate can be carried out in the desired process such as before the formation of the stress control layer or after the formation of the stress control layer. Therefore, in the transfer mask substrate of the present invention, the support may be one either before being subjected to the back etching or after having been subjected to the back etching.

Hereinbelow, the present invention will be described in further detail using examples.

FIGS. 5 to 8 are production process diagrams of stencil masks according to Examples 1 to 4. Incidentally, FIGS. 5 to 8 are partial enlarged views like FIG. 2.

EXAMPLE 1

Hereinbelow, Example 1 will be described using the production process diagram of FIG. 5.

Figure 5:
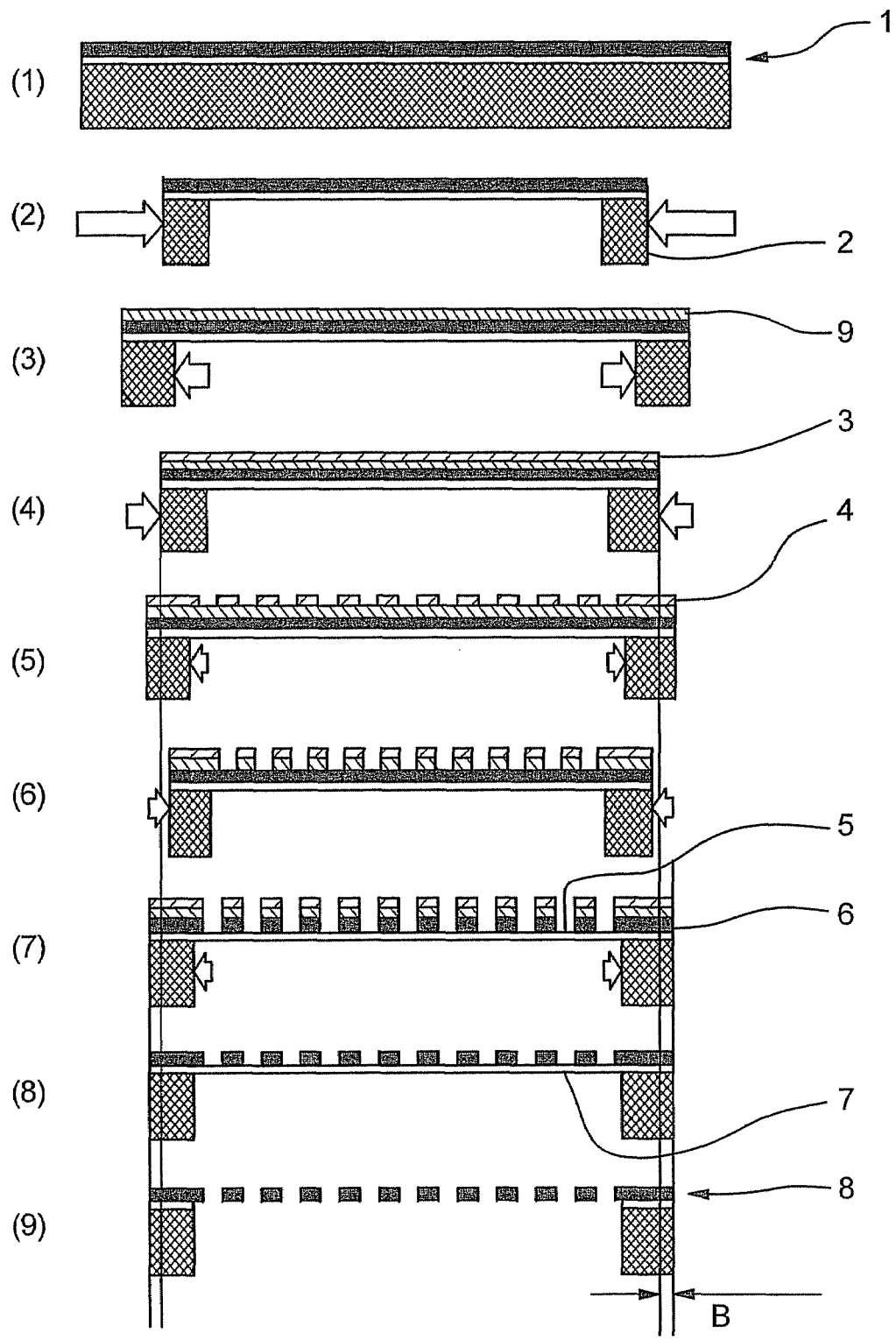
FIG. 5 is a production process diagram of a stencil mask according to Example 1.

First, an SOI substrate 1 was prepared (see FIG. 5(1)). Then, a strut was formed by carrying out etching from the back side (see FIG. 5(2)). For an etching mask (not illustrated) resist for the back etching, use can be made of, apart from metal such as $SiO_2$, Cr, Ti, Ta, Zr, Mo, or W, the foregoing chromium nitride (CrN), titanium nitride ($TiN_x$), tantalum nitride ($TaN_x$), zirconium nitride ($ZrN_x$), molybdenum nitride ($MoN_x$), tungsten nitride ($WN_x$), or the like. $SF_6$ is used as a main etching gas for the back etching, and a $C_xF_y$ gas is used for an etching shape control. In this event, the gases are introduced in a mixed state, or $SF_6$ and the $C_xF_y$ gas are introduced alternately.

Then, a stress control layer 9 was formed on an Si thin film layer 6 (see FIG. 5(3)). This stress control film 9 is a thin film as shown in a table of FIG. 9. In FIG. 9, a minus stress represents the side of a compressive stress.

Then, a resist layer 3 was formed on the surface of the substrate and subjected to baking (see FIG. 5(4)). The resist layer is a thin film as shown in the table of FIG. 9.

Then, a mask pattern was written by electron-beam writing in each thin film area etched on the back, while performing alignment adjustment, and then developed to thereby form a resist pattern 4 (see FIG. 5(5)). Using this resist as an etching mask, the stress control layer 9 and the Si thin film layer were etched using $SF_6$ as an etching main gas to thereby form an aperture pattern 5 in the Si thin film layer 6 (see FIG. 5(6) and (7)). A kind of aperture pattern, a film thickness of the thin film layer, a film stress, and so forth in this event were as shown in FIG. 9.

Subsequently, the remaining resist pattern 4 was peeled off and the stress control layer 9 was removed (see FIG. 5(8)).

Finally, an etching stopper 7 was removed to thereby obtain a stencil mask 8 (see FIG. 5(9)).

According to this example, a stress change amount generated in the mask production processes was canceled by the stress control layer so that a stress change amount of 2.5 N/m or less was achieved. As a result, there was obtained the stencil mask with a position offset of the mask pattern being 5 μm or less.

EXAMPLE 2

Figure 6:
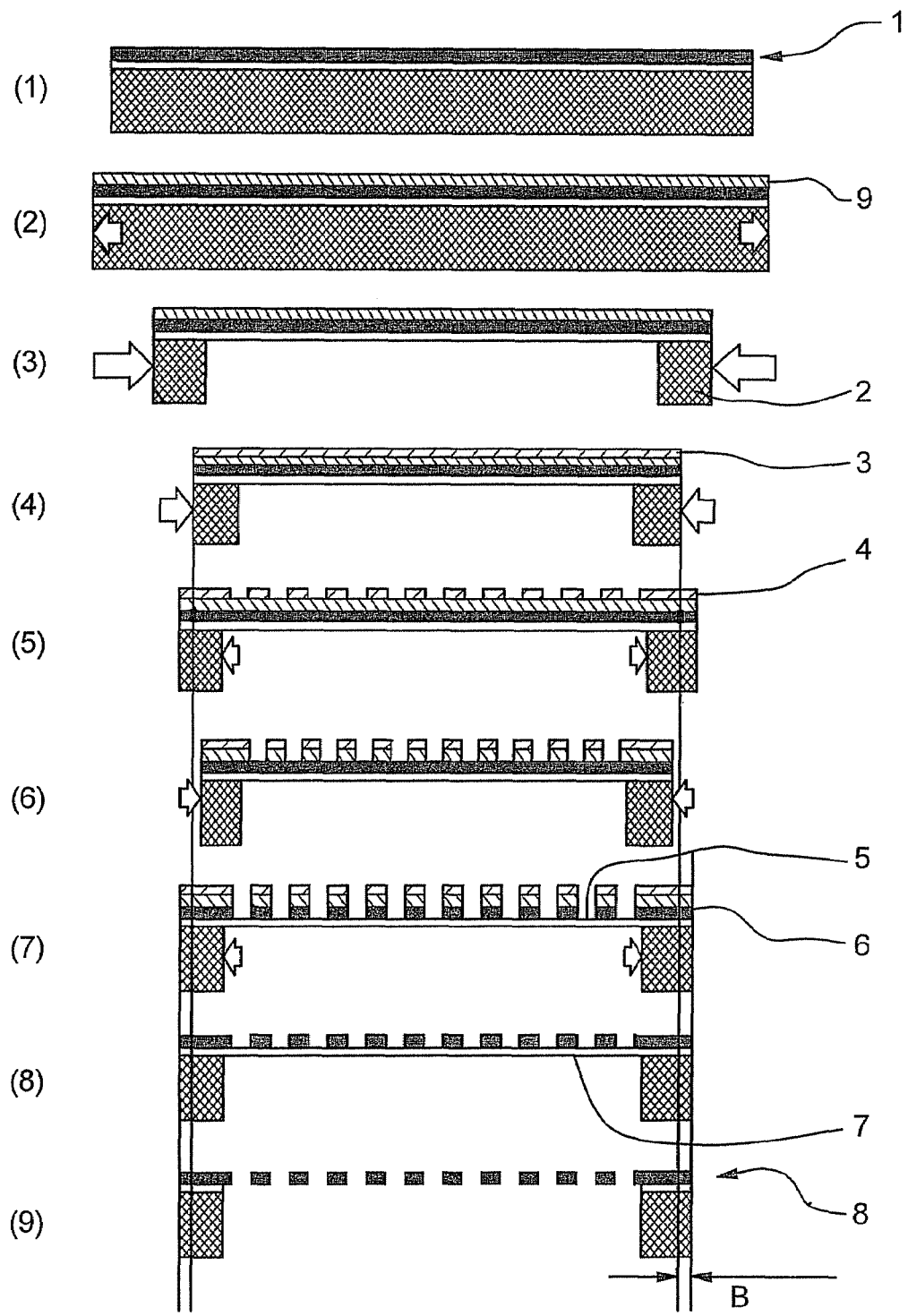
FIG. 6 is a production process diagram of a stencil mask according to Example 2.

FIG. 6 is a production process diagram according to a stencil mask of Example 2. In this example, the production was carried out like in Example 1 except that the stress control layer, the resist layer, the kind of aperture pattern, the film thickness of the thin film layer, the film stress, and so forth in Example 1 were changed as shown in FIG. 9, and the back etching and the stress control layer forming process were reversed in order.

According to this example, a stress change amount generated in the mask production processes was canceled by the stress control layer so that a stress change amount of 1.5 N/m or less was achieved. As a result, there was obtained the stencil mask with a position offset of the mask pattern being 2.5 µm or less.

EXAMPLE 3

Figure 7:
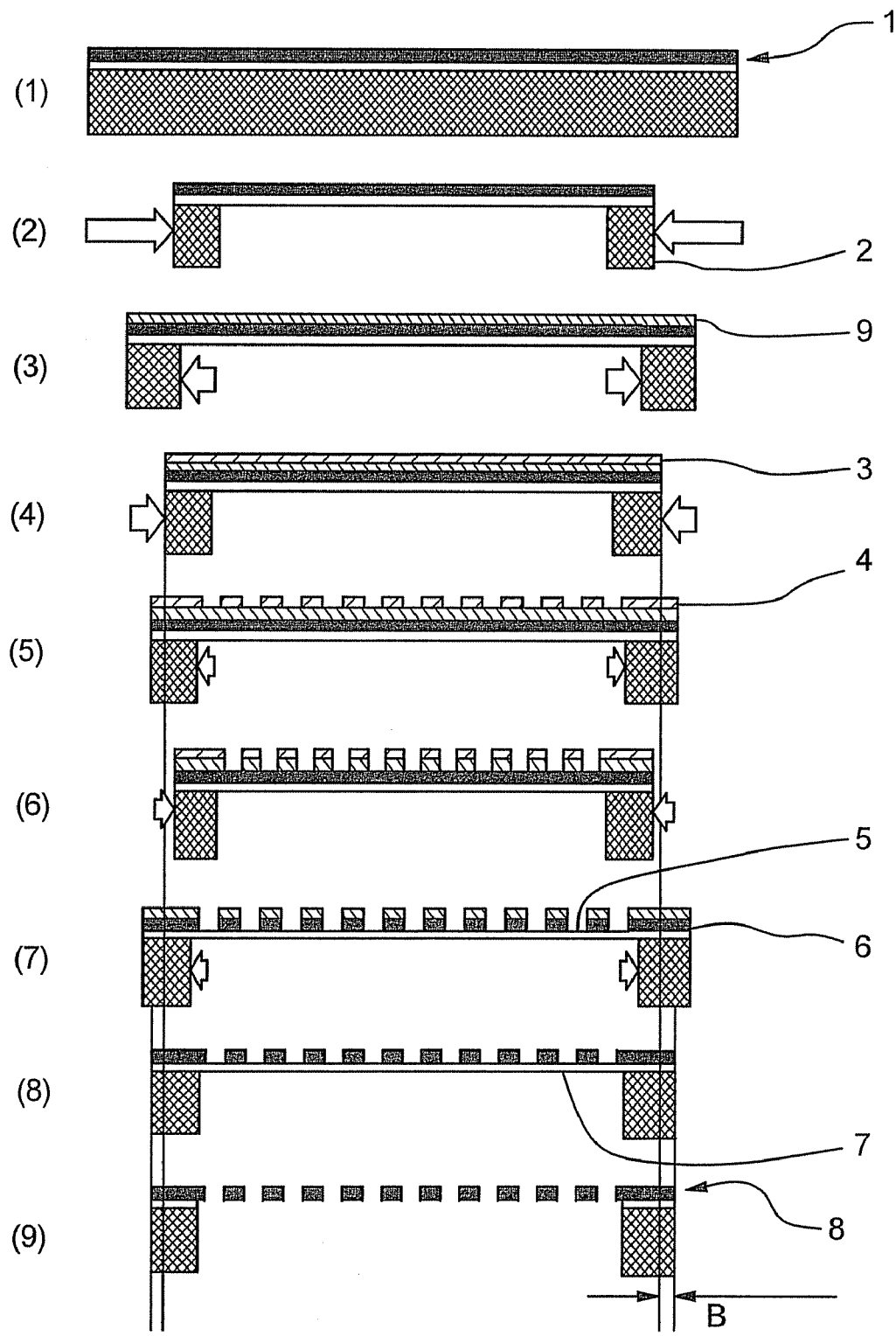
FIG. 7 is a production process diagram of a stencil mask according to Example 3.

FIG. 7 is a production process diagram according to a stencil mask of Example 3. In this example, the production was carried out like in Example 1 except that the stress control layer, the resist layer, the kind of aperture pattern, the film thickness of the thin film layer, the film stress, and so forth in Example 1 were changed as shown in FIG. 9, and further, the resist pattern was peeled off after etching the stress control layer, and then the Si thin film layer was etched. It is needless to say that the etching condition is properly selected following the change in material of the stress control layer.

According to this example, a stress change amount generated in the mask production processes was canceled by the stress control layer so that a stress change amount of 0.2 N/m or less was achieved. As a result, there was obtained the stencil mask with a position offset of the mask pattern being 0.4 µm or less.

EXAMPLE 4

Figure 8:
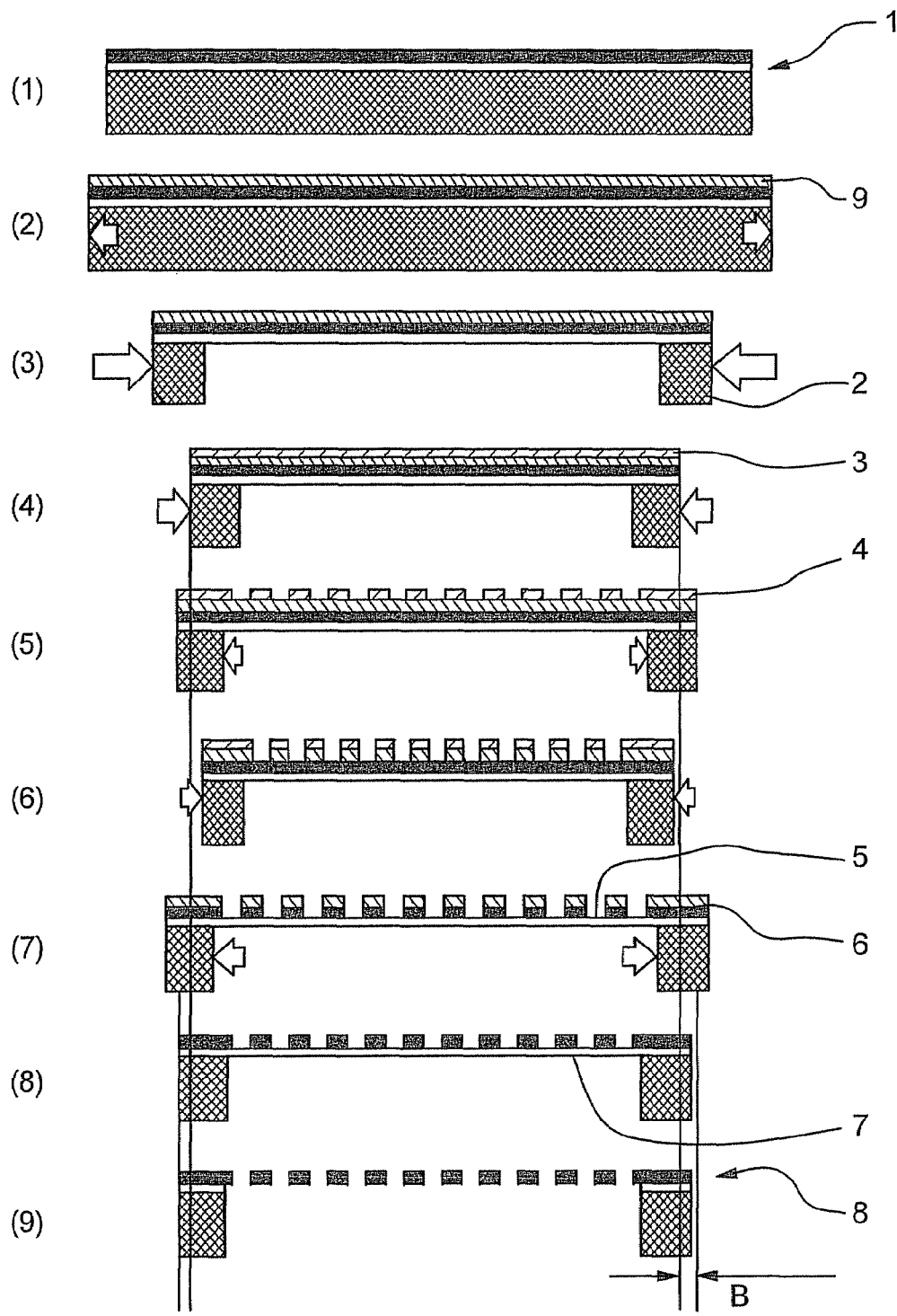
FIG. 8 is a production process diagram of a stencil mask according to Example 4.

FIG. 8 is a production process diagram according to a stencil mask of Example 4. In this example, the production was carried out like in Example 2 except that the stress control layer, the resist layer, the kind of aperture pattern, the film thickness of the thin film layer, the film stress, and so forth in Example 3 were changed as shown in FIG. 9, and the back etching and the stress control layer forming process were reversed in order.

According to this example, a stress change amount generated in the mask production processes was canceled by the stress control layer so that a stress change amount of 1.0 N/m or less was achieved. As a result, there was obtained the stencil mask with a position offset of the mask pattern being 1.3 µm or less.

The present invention is not limited to the foregoing examples.

In the foregoing examples, it is shown that the back etching is carried out before or after the formation of the stress control film, but not limited thereto.

Further, the kind and the film thickness of the resist are also not limited to the foregoing. With respect to the resist, even when using the present invention, it preferably has a low stress and also preferably has a thin film thickness.

INDUSTRIAL APPLICABILITY

According to the transfer mask producing method of the present invention, since the transfer mask production processes have, prior to the formation of the resist layer, the process of forming the stress control layer that cancels the stress change generated in the mask production processes, it is possible to produce the transfer mask with a high position accuracy. Further, according to the transfer mask of the present invention, it is possible to obtain the transfer mask having a high position accuracy by the use of such a transfer mask producing method. Further, according to the transfer mask substrate of the present invention, it is possible to provide the transfer mask substrate that can produce the transfer mask with a high position accuracy.

The invention claimed is:

1. A production method of a transfer mask, comprising:
   a step of preparing a substrate having a substrate for forming a support by back etching for supporting a thin film layer, an etching stopper layer formed on said substrate, and the thin film layer formed on said etching stopper layer;
   a step of carrying out back etching of the substrate;
   a step of forming a resist layer on said thin film layer;
   a step of carrying out exposure/development of a predetermined mask pattern to said resist layer to form a resist pattern; and
   a step of forming a mask pattern in the thin film layer by etching using said resist pattern,
   said method characterized by further comprising:
   a step of, before forming said resist layer, forming on said thin film layer a stress control layer that cancels a stress change of the thin film layer generated in production processes of the mask; and
   a step of etching said stress control layer along with formation of said mask pattern.

2. A production method of a transfer mask according to claim 1, characterized by comprising a step of removing the stress control layer after forming the mask pattern in the thin film layer.

3. A production method of a transfer mask according to claim 1, characterized in that the stress control layer is made of a material selected from amorphous carbon, DLC, $SiO_x$, and $SiO_xN_y$.

4. A production method of a transfer mask according to claim 2, characterized in that the stress control layer is made of a material selected from amorphous carbon, DLC, $SiO_x$, and $SiO_xN_y$.

* * * * *